US008283581B2

(12) United States Patent
Weng et al.

(10) Patent No.: US 8,283,581 B2
(45) Date of Patent: Oct. 9, 2012

(54) INTEGRAL KEYBOARD ASSEMBLY

(75) Inventors: An-Sheng Weng, Taipei (TW); Chih-Hsiang Chien, Taipei (TW); His-Yun Chen, Taipei (TW); Hsin-Hung Lai, Taipei (TW); Chun-Te Lee, Taipei (TW); Cheng-Min Chang, Taipei (TW); Chai-Wei Shih, Taipei (TW)

(73) Assignee: Shuttle Inc., Taipei (TW)

( * ) Notice: Subject to any disclaimer, the term of this patent is extended or adjusted under 35 U.S.C. 154(b) by 290 days.

(21) Appl. No.: 12/786,708

(22) Filed: May 25, 2010

(65) Prior Publication Data

US 2011/0240450 A1 Oct. 6, 2011

(30) Foreign Application Priority Data

Apr. 2, 2010 (TW) ............................... 99110456 A

(51) Int. Cl.
*H01H 13/70* (2006.01)
*H05K 7/16* (2006.01)

(52) U.S. Cl. .................. 200/5 A; 200/293; 361/679.08; 361/679.09

(58) Field of Classification Search .................. 200/5 A, 200/293–295, 303–305; 341/22; 345/168, 345/169; 361/679.01, 679.02, 679.08–679.17, 361/679.55, 679.56; 400/490–496
See application file for complete search history.

(56) References Cited

U.S. PATENT DOCUMENTS

| | | | | |
|---|---|---|---|---|
| 4,540,865 | A * | 9/1985 | Calder | 200/512 |
| 4,560,844 | A * | 12/1985 | Takamura et al. | 200/5 A |
| 4,851,618 | A * | 7/1989 | Amino et al. | 200/5 A |
| 6,489,576 | B2 * | 12/2002 | Ito et al. | 200/310 |
| 7,535,699 | B2 * | 5/2009 | Hamada et al. | 361/679.08 |
| 8,027,156 | B2 * | 9/2011 | Kobayashi et al. | 361/679.17 |
| 2003/0011971 | A1 * | 1/2003 | Suzuki et al. | 361/680 |
| 2006/0165465 | A1 * | 7/2006 | Wu | 400/491 |
| 2010/0091442 | A1 * | 4/2010 | Theobald et al. | 361/679.09 |
| 2010/0157523 | A1 * | 6/2010 | Kito et al. | 361/679.55 |

* cited by examiner

*Primary Examiner* — Michael Friedhofer
(74) *Attorney, Agent, or Firm* — Chun-Ming Shih; HDLS-IPR Services

(57) ABSTRACT

An integral keyboard assembly is provided. The integral keyboard assembly includes a top casing, a keyboard module, and a support plate. The first surface of the top casing is defined a keyboard bonding area where a plurality of openings is arranged as a keyboard structure distribution. The keyboard module includes multiple keys with interspaces formed therebetween. Each of the keys is inserted into a corresponding one of the openings. The support plate is coupled to the top casing so that the keyboard module is sandwiched between the top casing and the support plate. By implementing the present invention, the keyboard assembly has better integrity and space impression. Furthermore, the keyboard module is provided with improved support by utilizing the support plate.

12 Claims, 13 Drawing Sheets

INTEGRAL KEYBOARD ASSEMBLY

BACKGROUND OF THE INVENTION

1. Technical Field

The present invention relates to integral keyboard assemblies, and more particularly, to a keyboard assembly for use with a portable computer.

2. Description of Related Art

Due to continuous development of technology and information propagation, computer equipment plays an important role in the daily life of people nowadays. At present, commercially available computer equipment, whether it is a desktop personal computer (desktop PC), an all-in-one computer, or a portable personal computer (portable PC), is usually operated by an important hardware peripheral interface—a keyboard. A portable computer, in particular, can hardly efficiently work without a keyboard.

Referring to FIG. 1, there is shown a schematic view of a conventional portable computer 10. As shown in FIG. 1, a keyboard 11 disposed on the portable computer 10 is inserted into a computer body 12 from the exterior side thereof, after the computer body 12 has been assembled. Consequently, there is a gap between the computer body 12 and the keyboard 11 such assembled. Due to the gap, ambient dust and dirt/grease on a user's hands are likely to be grasped by the gap or further go deep below the keyboard 11 via the gap. As a result, invasion of dust into the portable computer 10 poses a problem with cleaning.

Furthermore, since the appearance of portable computers and casing design are gaining an increasingly great sense of technology, casings nicely furnished with a touch of metal are in wide use with the portable computers 10. Nonetheless, the plastic touch of the keyboard 11 remains unchanged. Hence, the casing and the keyboard 11 are neither equal in tactility nor compatible in appearance. As a result, the portable computer 10 is neither consistent in integrity of appearance nor attractive to buyers.

BRIEF SUMMARY OF THE INVENTION

The present invention relates to an integral keyboard assembly comprising a keyboard module, which is assembled from the structural side of the integral keyboard assembly to fix the keyboard module in position such that the keyboard assembly has better integrity and space impression.

The present invention relates to an integral keyboard assembly comprising a support plate for providing better support to a keyboard module.

The present invention relates to an integral keyboard assembly comprising a support plate with metal to shield electromagnetic interference (EMI) and block electrostatic discharge (ESD), so as to lower the risk of damaging a keyboard module.

The present invention relates to an integral keyboard assembly comprising sliding rails for engaging with a support plate so as for the support plate to be slidingly coupled to a top casing and thereby for a keyboard module to be easily replaced.

In order to achieve the above and other objectives, the present invention provides an integral keyboard assembly, including: a top casing having a first surface and a second surface, the first surface being defined with a keyboard bonding area, wherein a plurality of openings penetrating the top casing is disposed within the keyboard bonding area, with the plurality of openings arranged as a keyboard structure distribution; a keyboard module having a plurality of keys with interspaces formed therebetween, the keyboard module being disposed on the keyboard bonding area, wherein each of the keys is inserted into a corresponding one of the openings; and a support plate coupled to the top casing such that the keyboard module is sandwiched between the top casing and the support plate.

Implementation of the present invention at least involves the following inventive steps:

1. The keyboard module is installed from the structure side of the keyboard assembly; hence, the keyboard assembly has better integrity and space impression.

2. A support plate is disposed beneath the keyboard module so as to provide better support to the keyboard module.

3. The support plate contains metal is configured to shield electromagnetic interference (EMI) and block electrostatic discharge (ESD), so as to lower the risk of damaging the keyboard module.

4. The support plate is slidingly coupled to the top casing; hence, it is easy to change the keyboard module, and thus replacement of the keyboard module is feasible and efficient.

The features and advantages of the present invention are described in detail in the preferred embodiments of the present invention so as to enable persons skilled in the art to gain insight into the technical disclosure in the present invention and implement the present invention accordingly and readily understand the objectives and advantages of the present invention by making reference to the disclosure contained in the specification, the claims, and the drawings of the present invention.

DETAILED DESCRIPTION OF THE INVENTION

Figure 1:
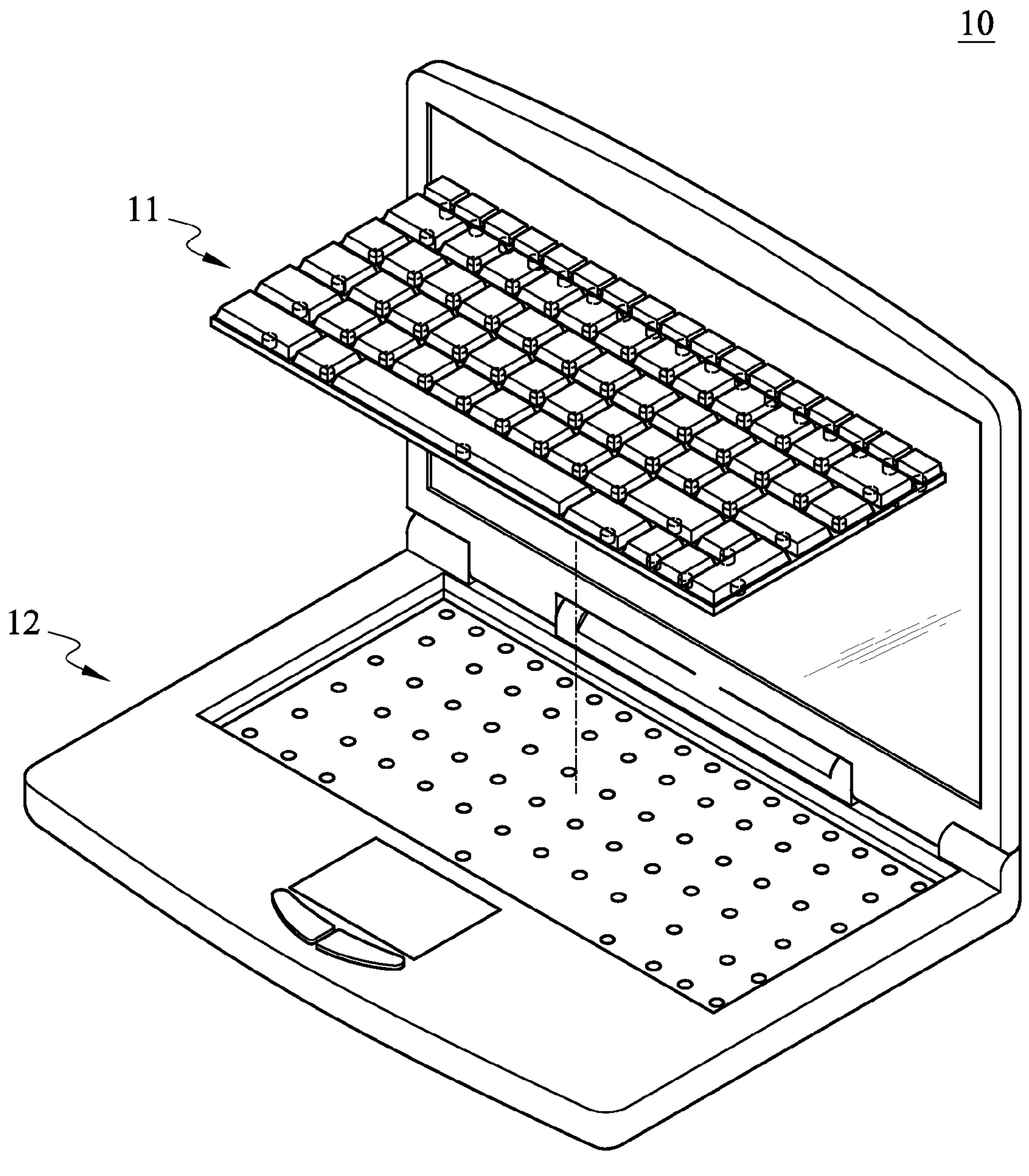
FIG. 1 (PRIOR ART)
FIG. 1 is a schematic view of a conventional portable computer.
Figure 2:
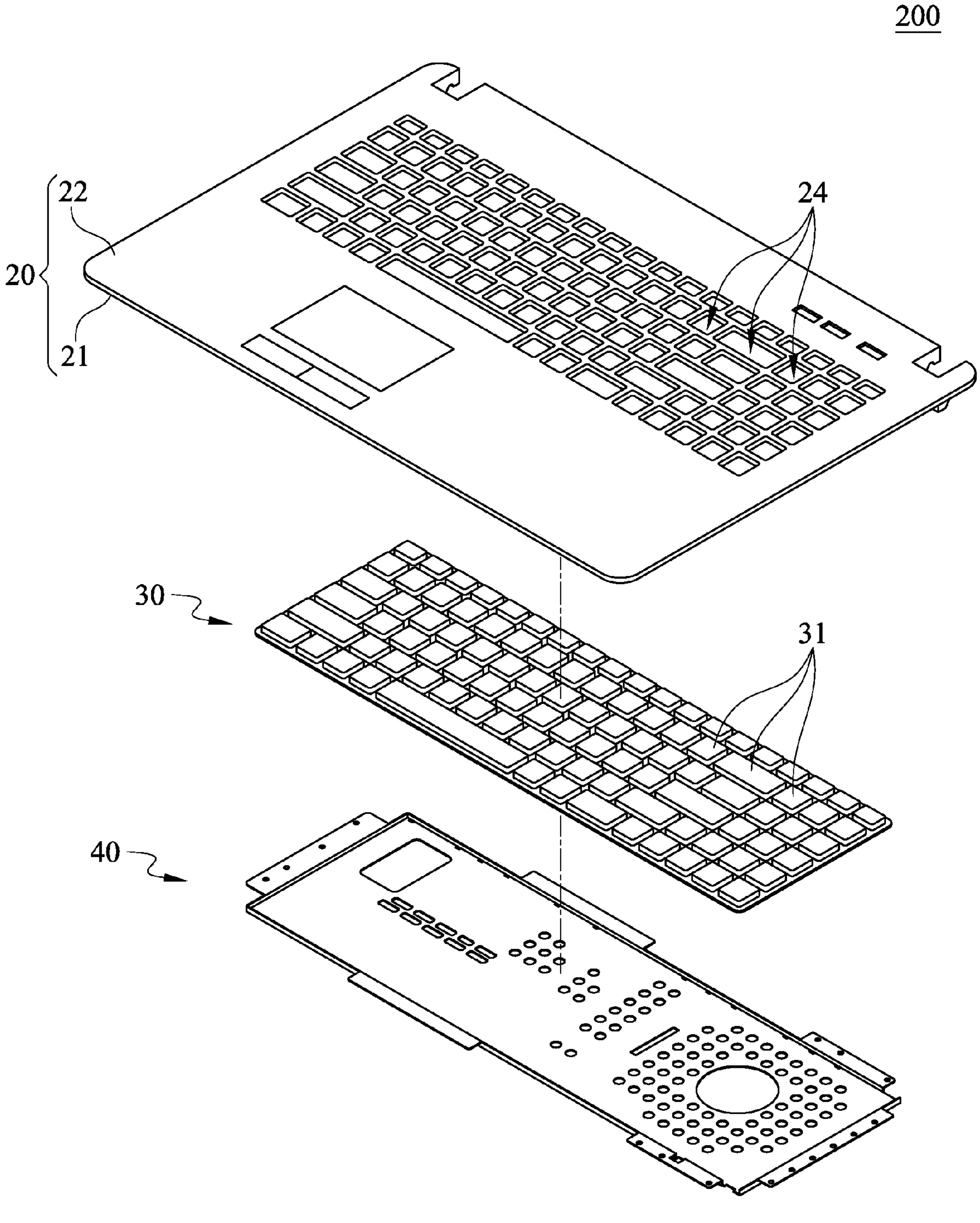
FIG. 2 is an exploded view of an integral keyboard assembly according to the present invention.

Referring to FIG. 2, in this embodiment, an integral keyboard assembly 200 includes a top casing 20, a keyboard module 30, and a support plate 40.

The top casing 20 has a first surface 21 and a second surface 22. The first surface 21 is defined as the structure side of the keyboard assembly 200. The second surface 22 is defined as the exterior side of the keyboard assembly 200. During the stage of designing the top casing 20, the positions of the keyboard module 30 and a touchscreen are planned.

Figure 3:
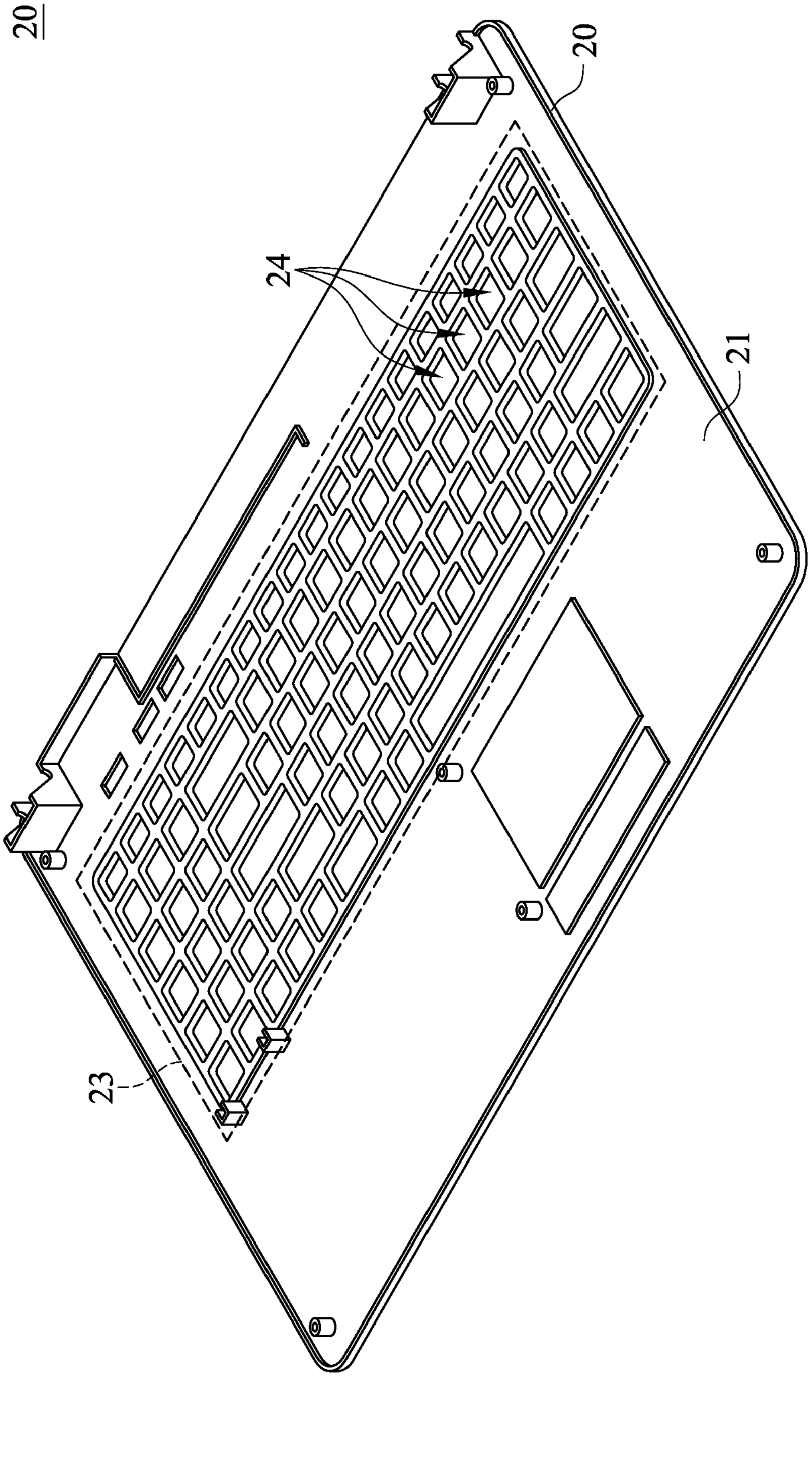
FIG. 3 is a schematic view of a top casing according to the present invention.

Referring to FIG. 3, the first surface 21 is defined with a keyboard bonding area 23. The keyboard bonding area 23 is quadrilateral, and is planned in advance for installing the keyboard module 30. A plurality of openings 24 which penetrates the top casing 20 is already formed within the keyboard bonding area 23. The plurality of openings 24 is arranged as a keyboard structure distribution.

Referring to FIG. 2, the keyboard module 30 has a plurality of keys 31. The keys 31 are independent of each other and separate from each other. Interspaces are formed between the keys 31. The keyboard module 30 is a unitary component. A flexible circuit board can function as the main body of the keyboard module 30; hence, the keyboard module 30 has characteristics, such as low weight, small thickness, and flexibility. Referring to FIG. 4B and FIG. 5A, the keyboard module 30 is disposed on the keyboard bonding area 23, and each of the keys 31 is inserted into a corresponding one of the openings 24, thereby allowing the top casing 20 to cover the interspaces between the keys 31. Viewing from the second surface 22, only the top casing 20 and the keys 31 exposed from the openings 24 are visible (shown in FIG. 8). Hence, the keyboard assembly 200 has better integrity and space impression.

Referring to FIG. 2, the support plate 40 is coupled to the top casing 20. As a result, the keyboard module 30 is sandwiched between the top casing 20 and the support plate 40, thereby allowing the keyboard module 30 to be fixed in position. Hence, the keyboard module 30 is not directly fixedly coupled to the top casing 20; instead, the keyboard module 30 is fixed in position by means of the support plate 40. The support plate 40 functions as a supporting surface when a user presses the keys 31, so as to reduce a sense of suspension which might otherwise arise whenever the keys 31 are pressed.

The support plate 40 is a metal plate or a plastic plate. Alternatively, the support plate 40 is a plastic plate with a metal layer disposed thereon such that the plastic plate is coated with metal. Hence, the support plate 40 not only provides better support to the keyboard module 30, but also shields electromagnetic interference (EMI) and blocks electrostatic discharge (ESD) when coated with metal.

Figure 4A:
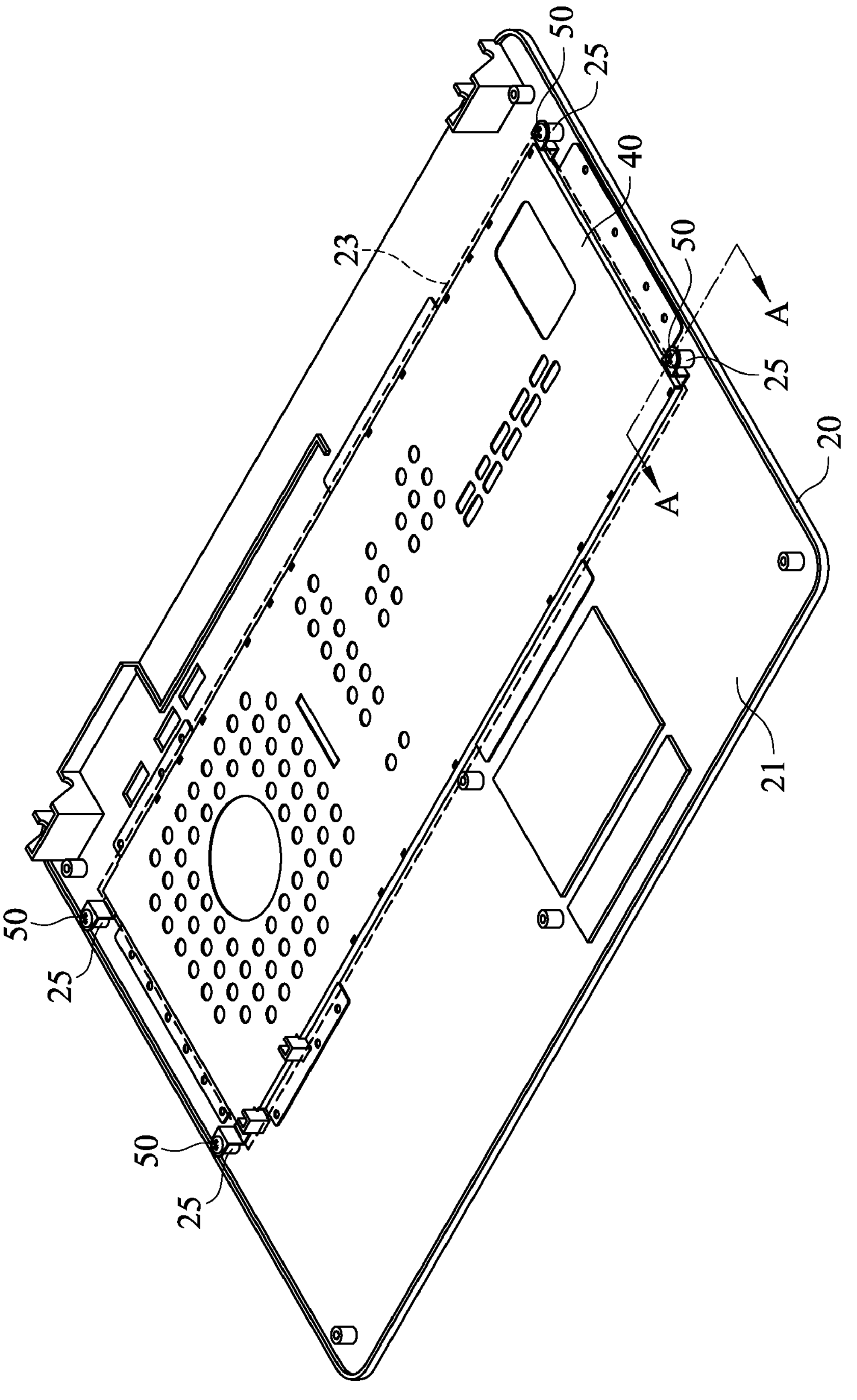
FIG. 4A is a schematic view of a support plate and the top casing locked and coupled together according to the present invention.
Figure 4B:
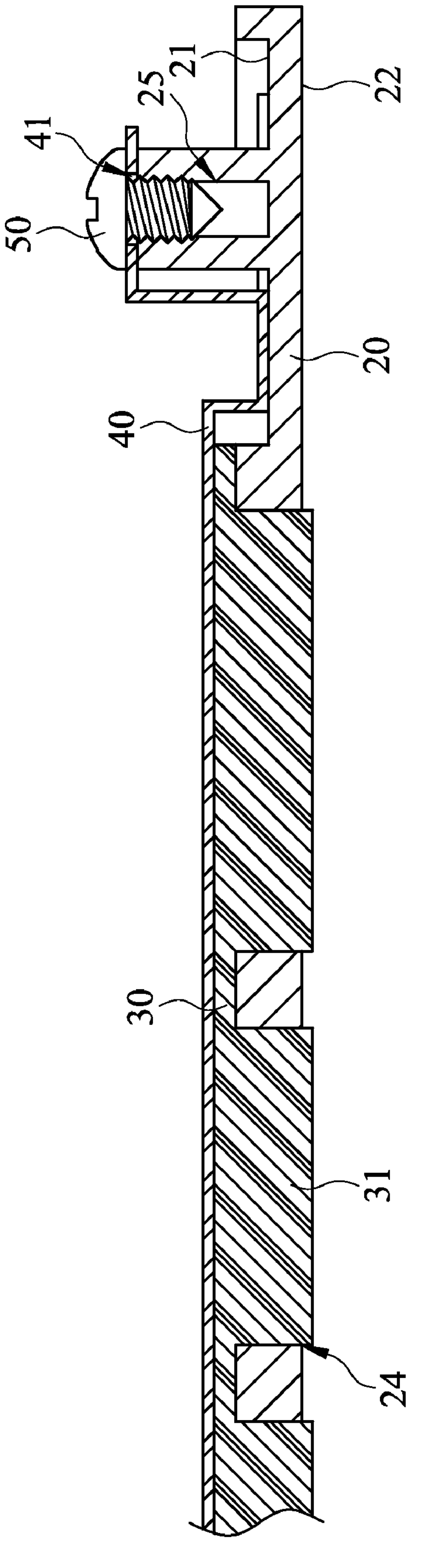
FIG. 4B is a cross-sectional view taken along line A-A of FIG. 4A.
Figure 5A:
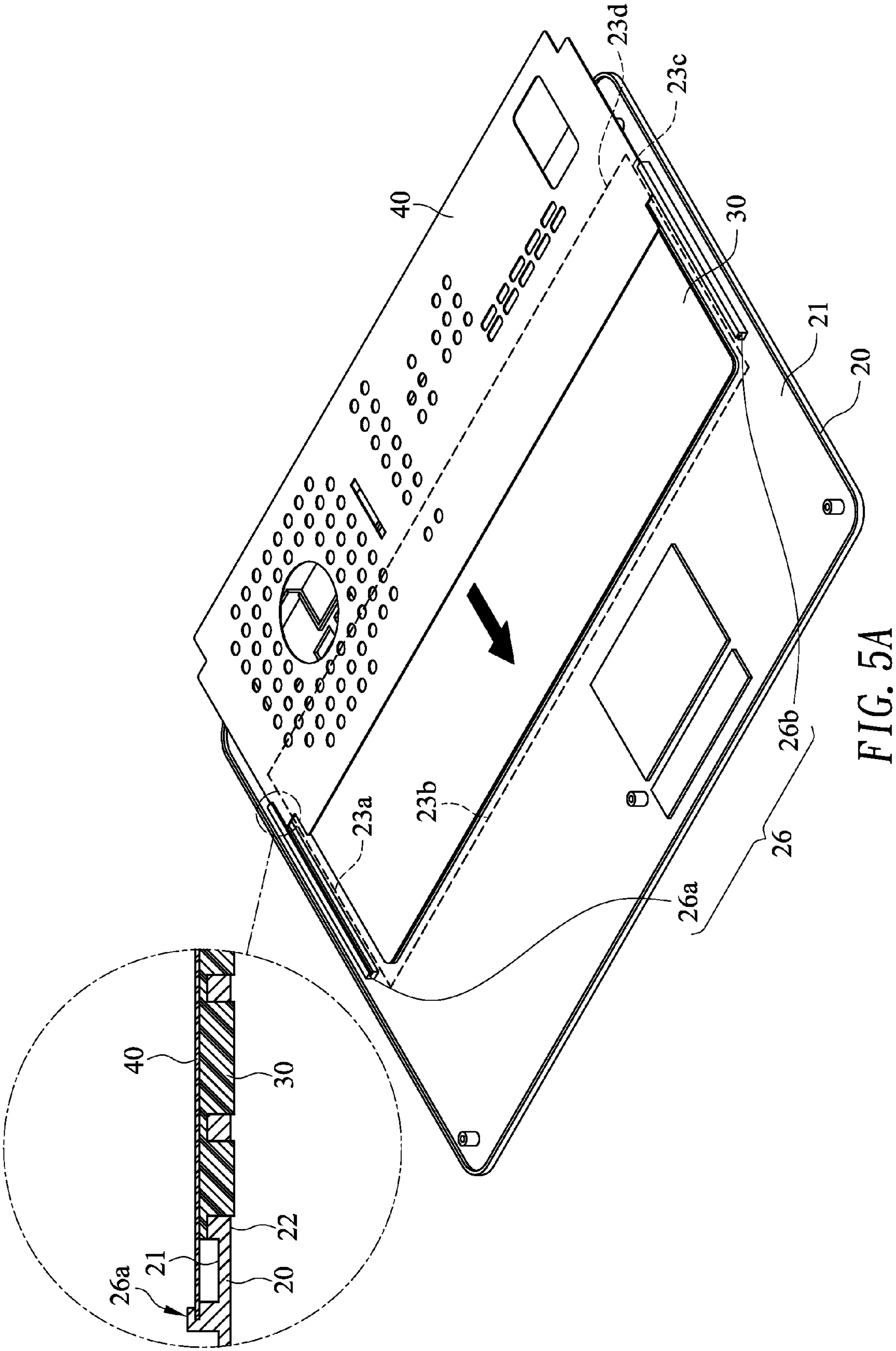
FIG. 5A is a schematic view with an inset showing a partial cross-sectional view of the support plate and the top casing slidingly coupled together in a first embodiment according to the present invention.

Referring to FIG. 4A and FIG. 4B, the support plate 40 is coupled to the top casing 20 by being screwed thereto by means of a plurality of screws 50. As shown in FIG. 4B, a plurality of threaded blind holes 25 is provided outside the keyboard bonding area 23 of the first surface 21, and the support plate 40 has through holes 41 corresponding in position to the threaded blind holes 25, thereby allowing the support plate 40 to be screwed to the top casing 20 by the screws 50, which penetrate the through holes 41 and the threaded blind holes 25.

Figure 5B:
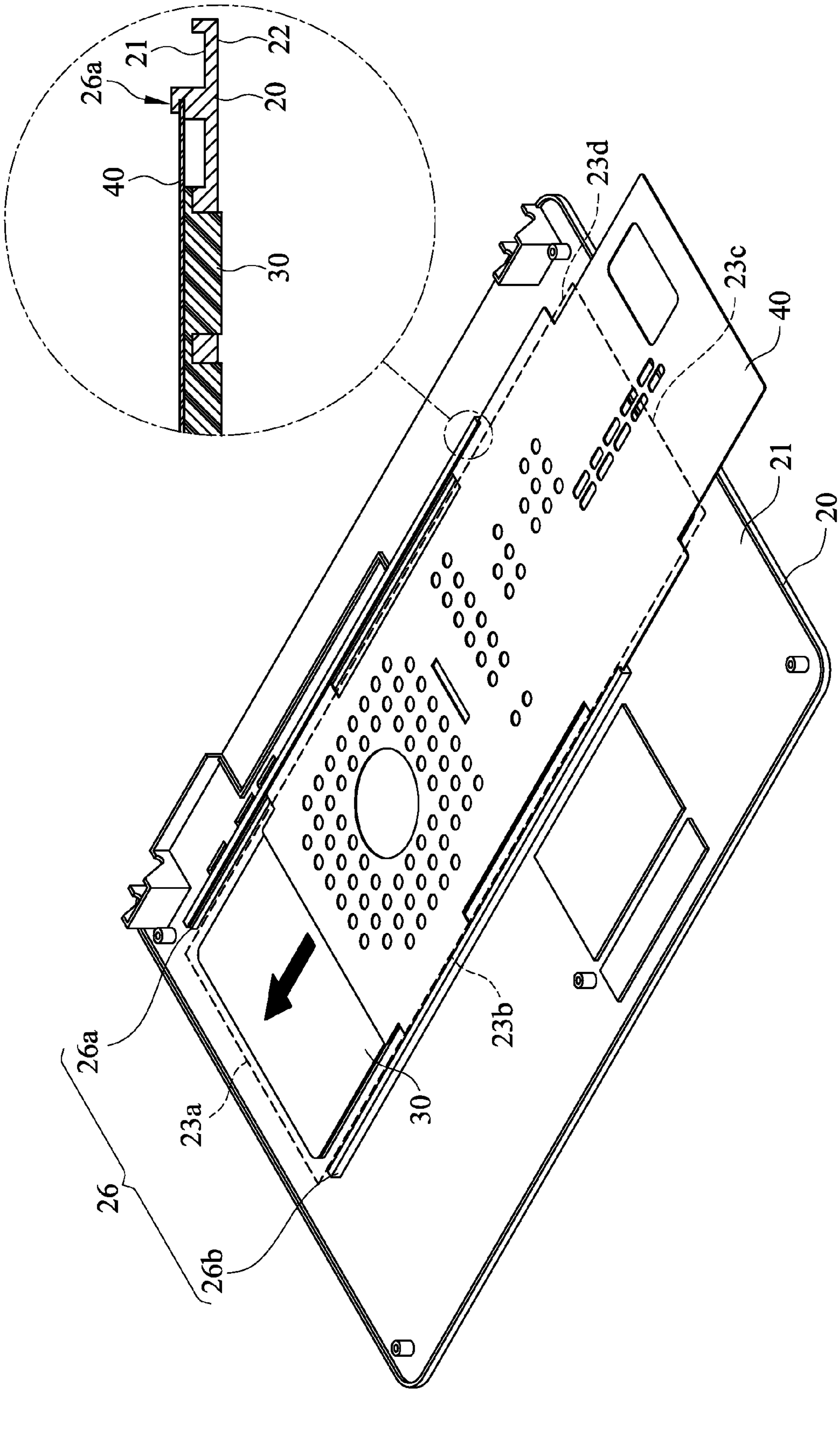
FIG. 5B is a schematic view with an inset showing a partial cross-sectional view of the support plate and the top casing slidingly coupled together in a second embodiment according to the present invention.

Referring to FIG. 5A and FIG. 5B, in addition to screwing the support plate 40 in position by the screws 50, it is feasible for the first surface 21 to have a sliding rail module 26 whereby the support plate 40 slides. An edge of the support plate 40 is engaged with the sliding rail module 26, and the support plate 40 is fixed in position by sliding.

The sliding rail module 26 comprises two sliding rails *26a*, *26b*. The sliding rails *26a*, *26b* are provided on two opposing short edges *23a*, *23c* of the keyboard bonding area 23 (as shown in FIG. 5A) or two opposing long edges *23b*, *23d* of the keyboard bonding area 23 (as shown in FIG. 5B), so as for two corresponding edges of the support plate 40 to be fixed in position.

Figure 5C:
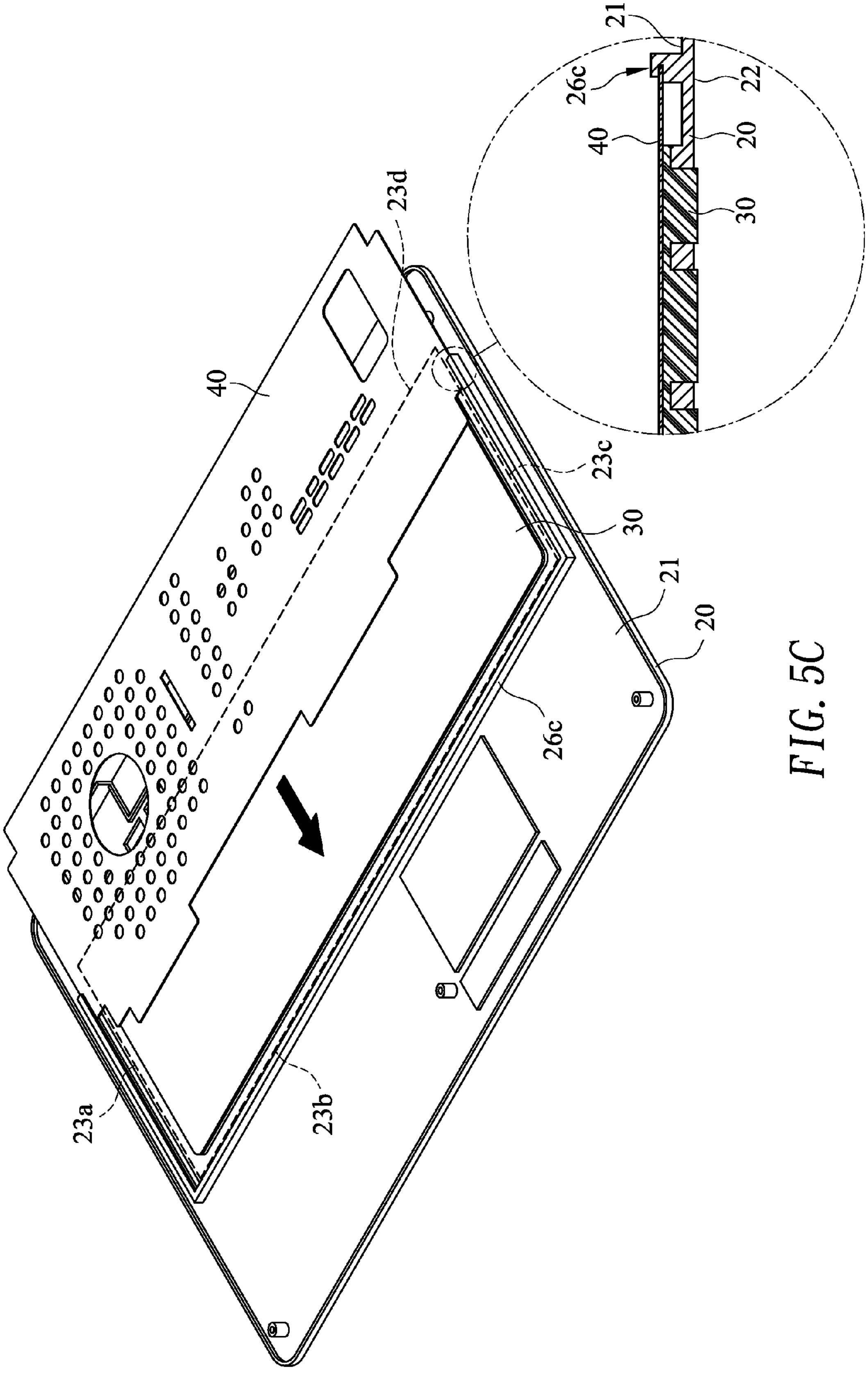
FIG. 5C is a schematic view with an inset showing a partial cross-sectional view of the support plate and the top casing slidingly coupled together in a third embodiment according to the present invention.
Figure 5D:
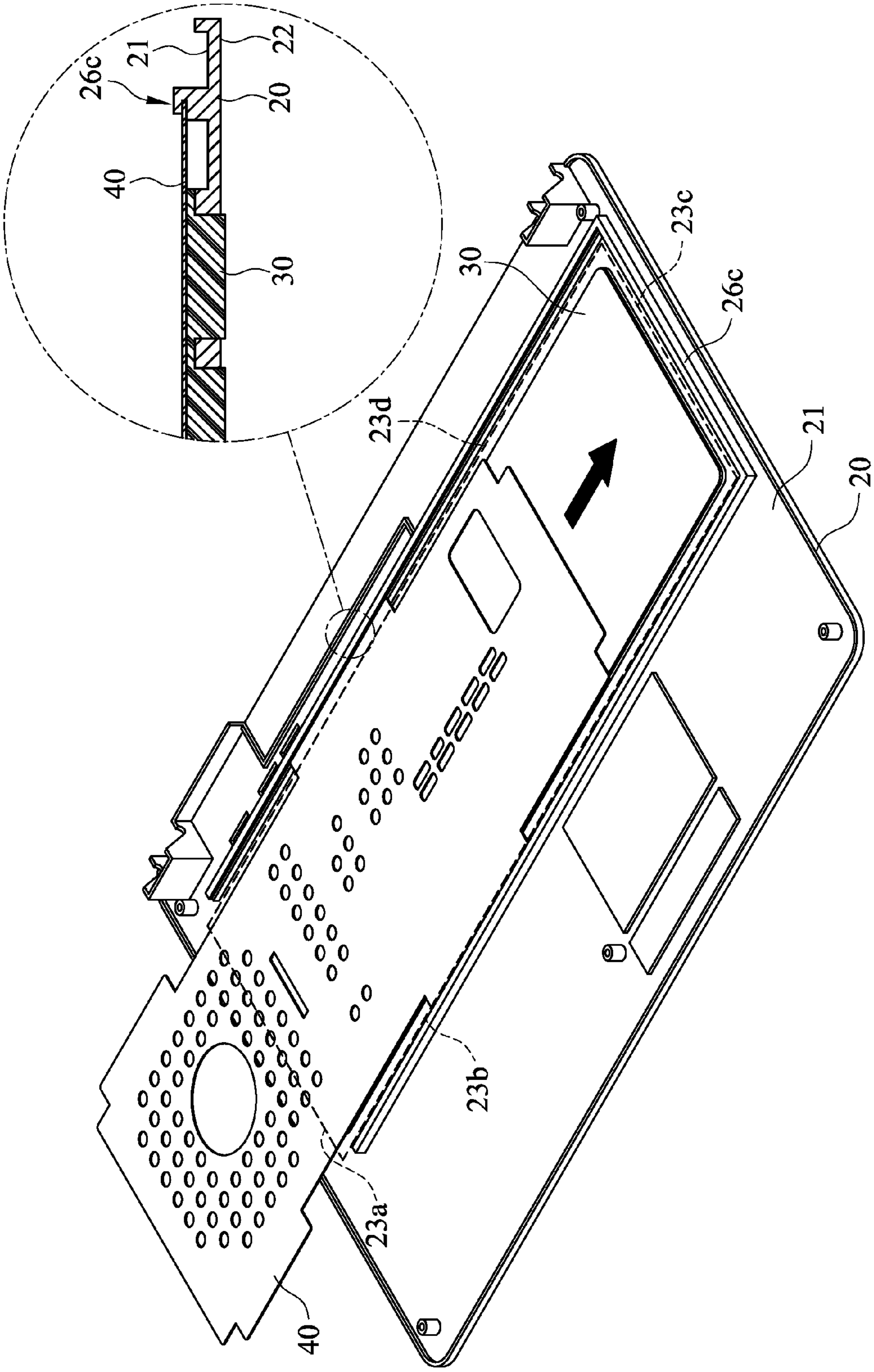
FIG. 5D is a schematic view with an inset showing a partial cross-sectional view of the support plate and the top casing slidingly coupled together in a fourth embodiment according to the present invention.

Referring to FIG. 5C and FIG. 5D, the sliding rail module 26 comprises a U-shaped sliding rail *26c*. As shown in FIG. 5C, the U-shaped sliding rail *26c* is positioned at the long edge *23b* and the two short edges *23a*, *23c* of the keyboard bonding area 23, and is absent from the long edge *23d*. The support plate 40 can slide inward from the long edge *23d*, until the corresponding edges of the support plate 40 are engaged with the U-shaped sliding rail *26c*.

Referring to FIG. 5D, the U-shaped sliding rail *26c* is positioned at the two long edges *23b*, *23d* and the short edge *23c* of the keyboard bonding area 23, and is absent from the short edge *23a*. The support plate 40 can slide inward from the short edge *23a*, so as to be fixed to the top casing 20. As a result, the keyboard module 30 is sandwiched between the top casing 20 and the support plate 40.

Figure 6A:
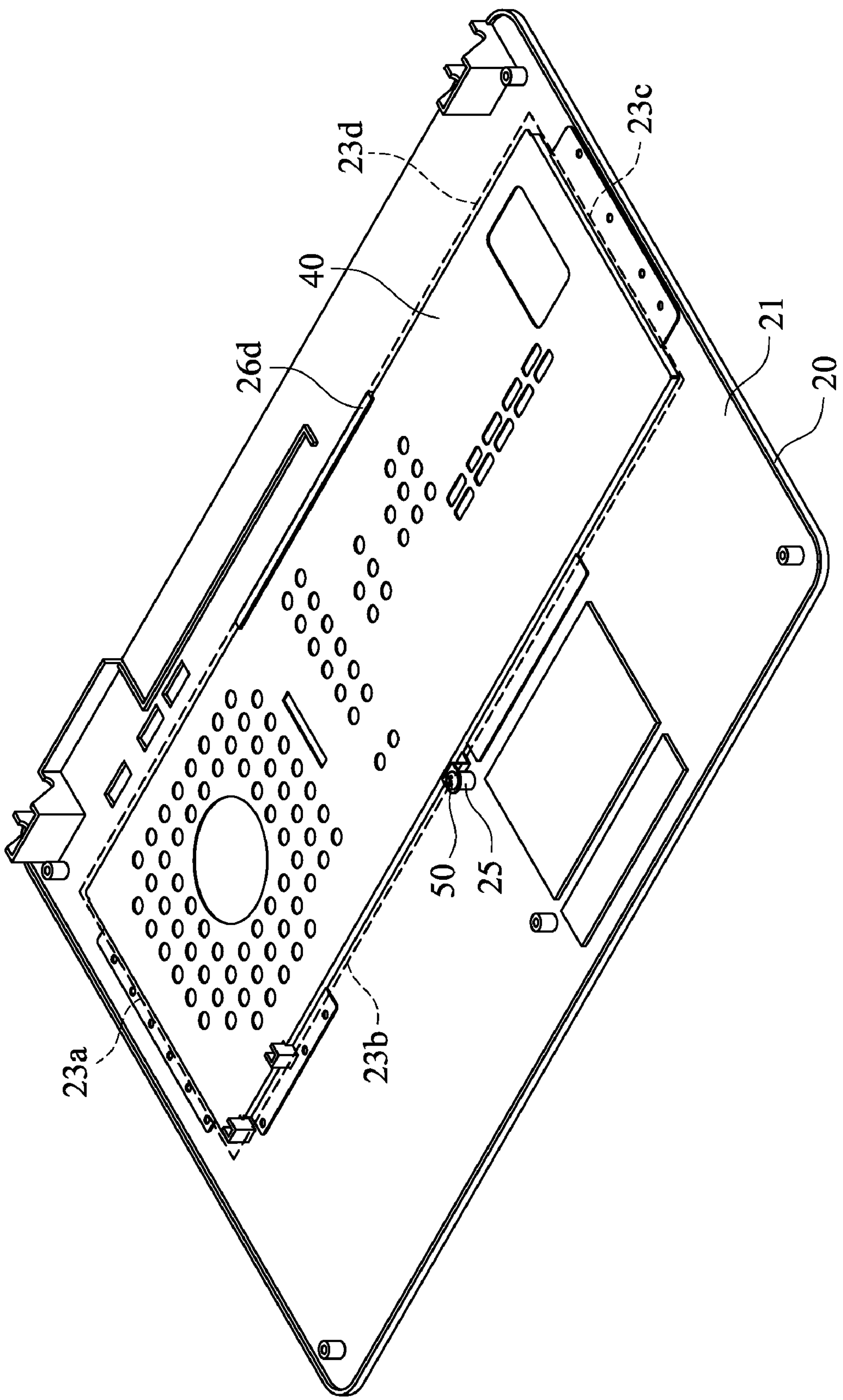
FIG. 6A is a schematic view of the support plate and the top casing locked and slidingly coupled together according to the present invention.
Figure 6B:
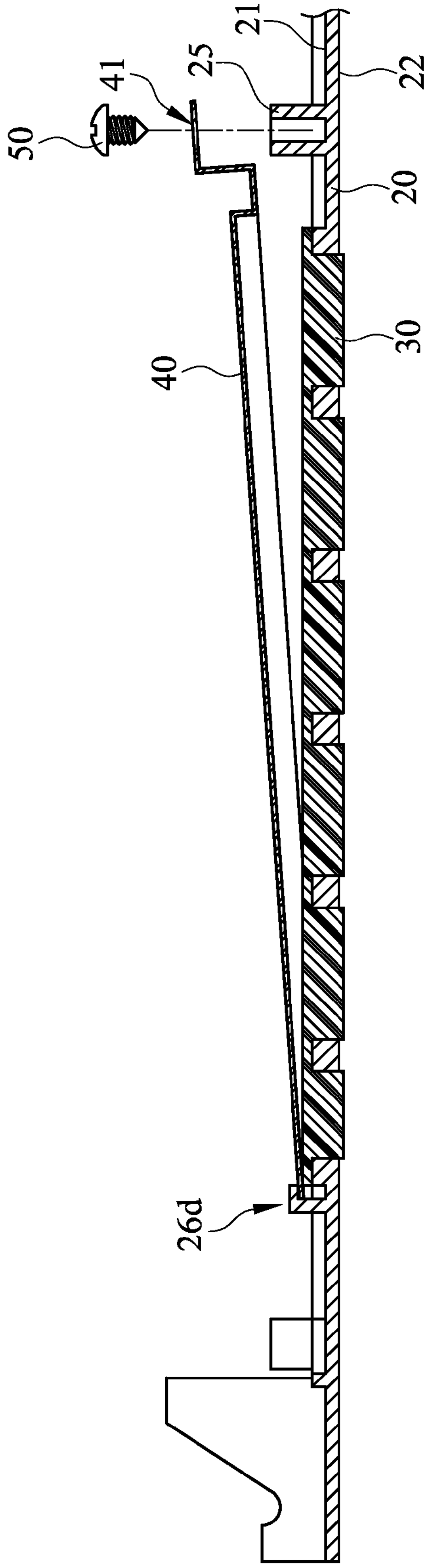
FIG. 6B is a cross-sectional view of the support plate and the top casing shown in FIG. 6A according to the present invention.

Referring to FIG. 6A and FIG. 6B, the two aforesaid means of coupling are combined, that is, a sliding rail *26d* is positioned at the long edge *23d* of the keyboard bonding area 23, and at least one threaded blind hole 25 is provided at the other long edge *23b* of the keyboard bonding area 23. As shown in FIG. 6B, the support plate 40 has a through hole 41 corresponding in position to the threaded blind hole 25. Hence, an edge of the support plate 40 is fixed to sliding rail *26d*, and the support plate 40 is fixed in position by means of the screw 50 penetrating the through hole 41 and the threaded blind hole 25.

In conclusion, the support plate 40 is fixed to the first surface 21 by screwing or sliding, and is configured to enable the keyboard module 30 to be fixed in position. However, once the keyboard module 30 is damaged and thus needs to be replaced, it is feasible to remove the support plate 40 in order to install a brand-new said keyboard module 30. Hence, maintenance and replacement of the keyboard module 30 is easy.

Figure 7:
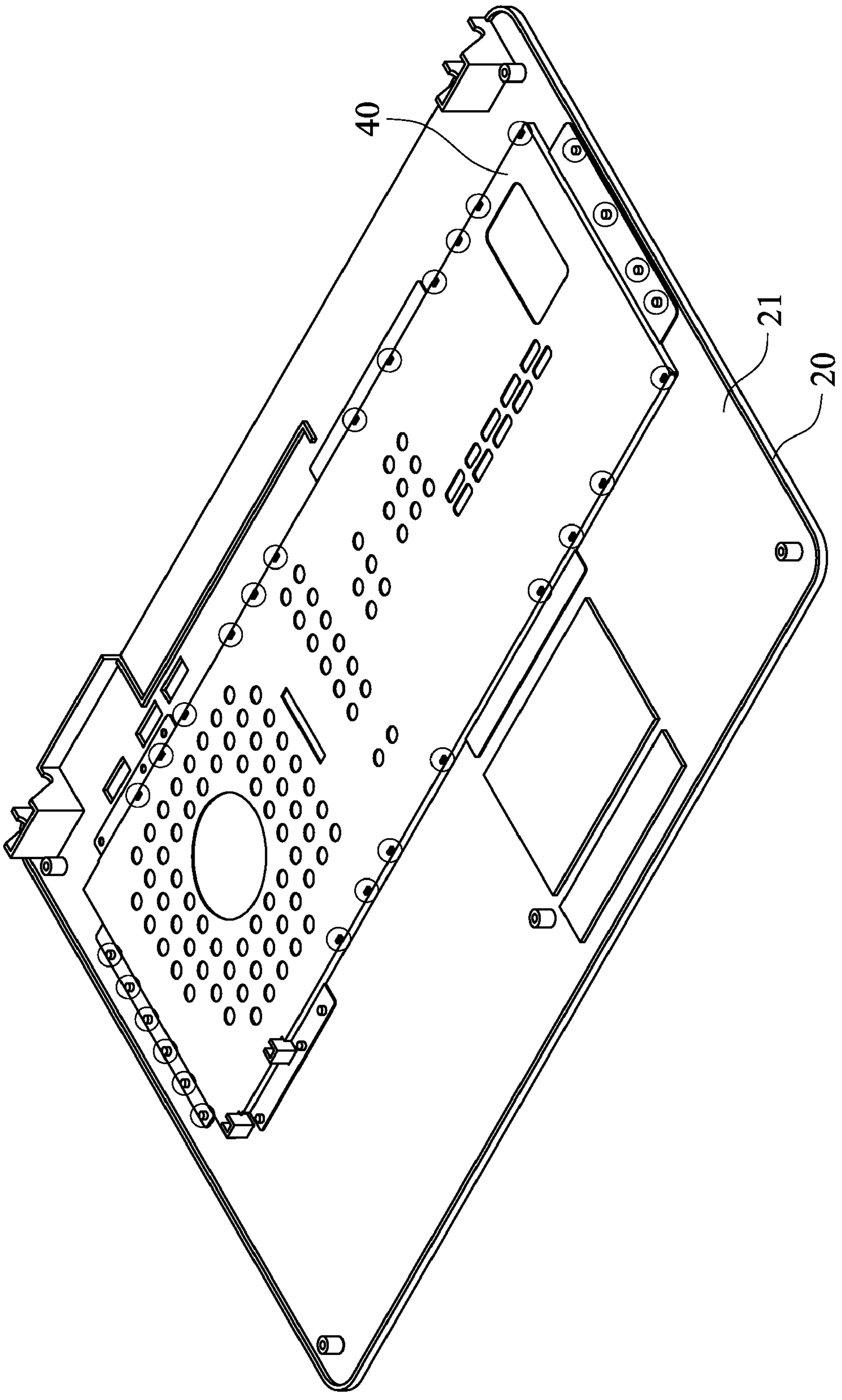
FIG. 7 is a schematic view of the support plate and the top casing weldingly coupled together according to the present invention.

Referring to FIG. 7, the support plate 40 is permanently fixed to the first surface 21 by performing a welding process on the periphery of the support plate 40. As shown in FIG. 7, the contacts for welding are circled.

Figure 8:
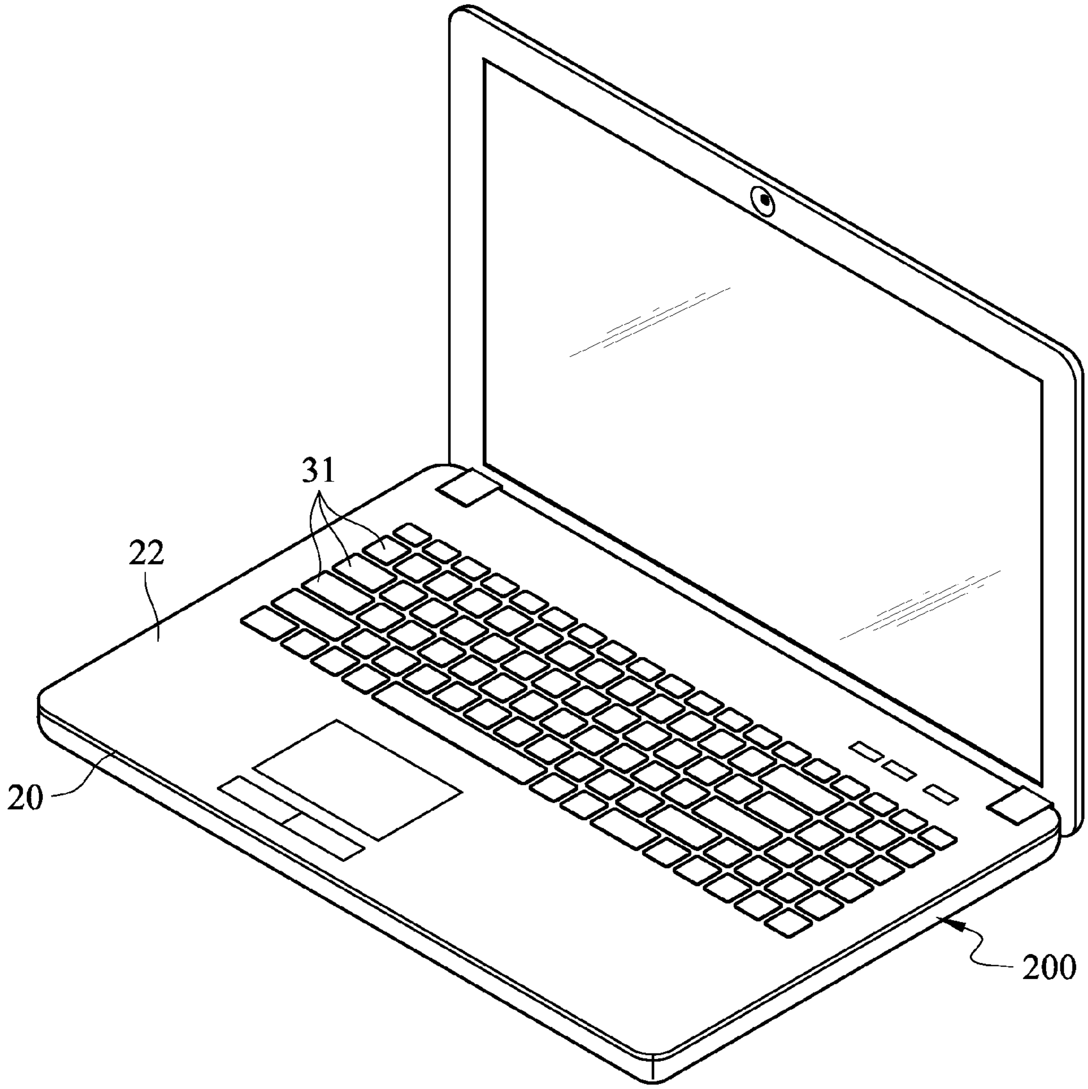
FIG. 8 is a schematic view of application of the integral keyboard assembly according to the present invention.

Referring to FIG. 8, as a result of implementation of this embodiment, after the keyboard assembly 200 is installed on a portable computer, the keyboard module 30 is covered with the top casing 20, and portions of the keys 31 are exposed. Hence, not only does the keyboard assembly 200 have better integrity and space impression, but the portable computer looks better.

The foregoing embodiments are provided to illustrate and disclose the technical features of the present invention so as to enable persons skilled in the art to understand the disclosure of the present invention and implement the present invention accordingly, and are not intended to be restrictive of the scope of the present invention. Hence, all equivalent modifications and variations made to the foregoing embodiments without departing from the spirit and principles in the disclosure of the present invention should fall within the scope of the invention as set forth in the appended claims.

What is claimed is:

1. An integral keyboard assembly, comprising: a top casing having a first surface and a second surface, the first surface being defined with a keyboard bonding area, wherein a plurality of openings penetrating the top casing is disposed within the keyboard bonding area and the plurality of openings is arranged as a keyboard structure distribution; a keyboard module having a plurality of keys with interspaces formed therebetween, the keyboard module being disposed on the keyboard bonding area, wherein each of the keys is inserted into a corresponding said opening; and a support plate coupled to the top casing such that the keyboard module is sandwiched between the top casing and the support plate, wherein the first surface includes a sliding rail module, and an edge of the support plate is fixed to the sliding rail module.

2. The integral keyboard assembly of claim 1, wherein the first surface includes a plurality of threaded blind holes, and the support plate includes through holes corresponding in position to the threaded blind holes, thereby allowing the support plate to be screwed to the top casing by screws penetrating the through holes and the threaded blind holes.

3. The integral keyboard assembly of claim 2, wherein the threaded blind holes are provided outside the keyboard bonding area.

4. The integral keyboard assembly of claim 1, wherein the sliding rail module comprises two sliding rails provided on two opposing short edges of the keyboard bonding area.

5. The integral keyboard assembly of claim 1, wherein the sliding rail module comprises two sliding rails provided on two opposing long edges of the keyboard bonding area.

6. The integral keyboard assembly of claim 1, wherein the sliding rail module comprises a U-shaped sliding rail positioned at a long edge and two short edges of the keyboard bonding area.

7. The integral keyboard assembly of claim 1, wherein the sliding rail module comprises a U-shaped sliding rail positioned at two long edges and a short edge of the keyboard bonding area.

8. The integral keyboard assembly of claim 1, wherein the support plate is fixed to the first surface by performing a welding process on a periphery of the support plate.

9. The integral keyboard assembly of claim 1, wherein the support plate is a plastic plate.

10. The integral keyboard assembly of claim 1, wherein the support plate is a plastic plate with a metal layer disposed thereon.

11. The integral keyboard assembly of claim 1, wherein the support plate is a metal plate.

12. An integral keyboard assembly, comprising: a top casing having a first surface and a second surface, the first surface being defined with a keyboard bonding area, wherein a plurality of openings penetrating the top casing is disposed within the keyboard bonding area and the plurality of openings is arranged as a keyboard structure distribution; a keyboard module having a plurality of keys with interspaces formed therebetween, the keyboard module being disposed on the keyboard bonding area, wherein each of the keys is inserted into a corresponding said opening; and a support plate coupled to the top casing such that the keyboard module is sandwiched between the top casing and the support plate, wherein the first surface includes a sliding rail positioned at a long edge of the keyboard bonding area and at least one threaded blind hole provided at another long edge of the keyboard bonding area, while the support plate includes a through hole corresponding in position to the threaded blind hole, whereby when an edge of the support plate is fixed to the sliding rail, at least one screw penetrating the through hole and the threaded blind hole fixes the support plate in position.

* * * * *